(12) United States Patent
Weyers et al.

(10) Patent No.: US 11,424,358 B2
(45) Date of Patent: Aug. 23, 2022

(54) SEMICONDUCTOR DEVICE WITH SENSOR FOR CRACK DETECTION

(71) Applicant: Infineon Technologies Dresden GmbH & Co. KG, Dresden (DE)

(72) Inventors: Joachim Weyers, Hoehenkirchen (DE); Andreas Boehm, Neubiberg (DE); Franz Hirler, Isen (DE); Enrique Vecino Vazquez, Munich (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 65 days.

(21) Appl. No.: 16/838,189

(22) Filed: Apr. 2, 2020

(65) Prior Publication Data

US 2020/0321463 A1 Oct. 8, 2020

(30) Foreign Application Priority Data

Apr. 3, 2019 (EP) .................................... 19167047

(51) Int. Cl.
  *H01L 29/78* (2006.01)
  *H01L 29/06* (2006.01)
  (Continued)

(52) U.S. Cl.
  CPC ...... *H01L 29/7811* (2013.01); *H01L 29/0615* (2013.01); *H01L 29/0692* (2013.01);
  (Continued)

(58) Field of Classification Search
  CPC ............ H01L 29/7811; H01L 29/0615; H01L 29/0692; H01L 29/0847; H01L 29/1095;
  (Continued)

(56) References Cited

U.S. PATENT DOCUMENTS

2010/0207206 A1* 8/2010 Krischke ............. H01L 29/7813
  257/337
2014/0367772 A1 12/2014 Mauder et al.
  (Continued)

FOREIGN PATENT DOCUMENTS

DE 102015106707 A1 11/2016
JP 3357804 B2 12/2002

*Primary Examiner* — Mohammad M Hoque
(74) *Attorney, Agent, or Firm* — Murphy, Bilak & Homiller, PLLC

(57) ABSTRACT

A semiconductor device includes a semiconductor body comprising a first surface, a second surface opposite to the first surface, an active region, and an edge region surrounding the active region in a horizontal plane. The semiconductor device further includes a plurality of transistor cells at least partly integrated in the active region. Each transistor cell includes a drift region separated from a source region by a body region, and a gate electrode dielectrically insulated from the body region. The semiconductor device also includes a sensor device having a first sensor region of a first doping type integrated in the edge region. The first sensor region is electrically coupled to a first contact pad and to a second contact pad. Each contact pad is arranged either on the first surface or on the second surface. The sensor device at least partially extends around the active region.

15 Claims, 8 Drawing Sheets

(51) Int. Cl.
    *H01L 29/08*     (2006.01)
    *H01L 29/10*     (2006.01)
    *H01L 29/40*     (2006.01)
    *H01L 29/423*     (2006.01)
    *H01L 29/49*     (2006.01)
    *H01L 29/66*     (2006.01)

(52) U.S. Cl.
    CPC ...... *H01L 29/0847* (2013.01); *H01L 29/1095* (2013.01); *H01L 29/404* (2013.01); *H01L 29/4238* (2013.01); *H01L 29/49* (2013.01); *H01L 29/66666* (2013.01); *H01L 29/7827* (2013.01)

(58) Field of Classification Search
    CPC ... H01L 29/404; H01L 29/4238; H01L 29/49; H01L 29/66666; H01L 29/7827; H01L 29/0634; H01L 29/0638; H01L 29/7803
    USPC ........................................................ 257/335
    See application file for complete search history.

(56) References Cited

U.S. PATENT DOCUMENTS

2015/0333060 A1* 11/2015 Decker ............... H01L 29/7827
    257/392
2017/0250255 A1     8/2017 Siemieniec et al.

* cited by examiner

SEMICONDUCTOR DEVICE WITH SENSOR FOR CRACK DETECTION

TECHNICAL FIELD

The instant disclosure relates to a semiconductor device, in particular to a semiconductor device with an integrated sensor device.

BACKGROUND

Semiconductor devices such as insulated gate power transistor devices, e.g., power MOSFETs (Metal Oxide Semiconductor Field-Effect Transistors), are widely used as electronic switches in various types of electronic applications. Such semiconductor devices are usually formed in a semiconductor body. At its outer edges, the semiconductor bodies are often prone to so-called chip cracks. That is, material forming the semiconductor body may crack or even chip off. A chip or crack may initially be comparably small but may increase over time. Small cracks may not have an impact on the operation of the semiconductor device at all. However, cracks exceeding a certain size may negatively affect the operation of the semiconductor device integrated in the semiconductor body, and may even lead to the failure of the device.

It is desirable to provide a semiconductor device that provides the possibility of detecting chip cracks already at an early stage.

SUMMARY

One example relates to a semiconductor device. The semiconductor device includes a semiconductor body including a first surface, a second surface opposite to the first surface, an active region, and an edge region surrounding the active region in a horizontal plane. The semiconductor device further includes a plurality of transistor cells at least partly integrated in the active region, each transistor cell including a source region, a body region, a drift region separated from the source region by the body region, and a gate electrode dielectrically insulated from the body region. The semiconductor device further includes a sensor device, wherein the sensor device includes a first sensor region of a first doping type integrated in the edge region, wherein the first sensor region is electrically coupled to a first contact pad and to a second contact pad, each of the first contact pad and the second contact pad arranged either on the first surface or on the second surface. The sensor device at least partially extends around the active region.

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
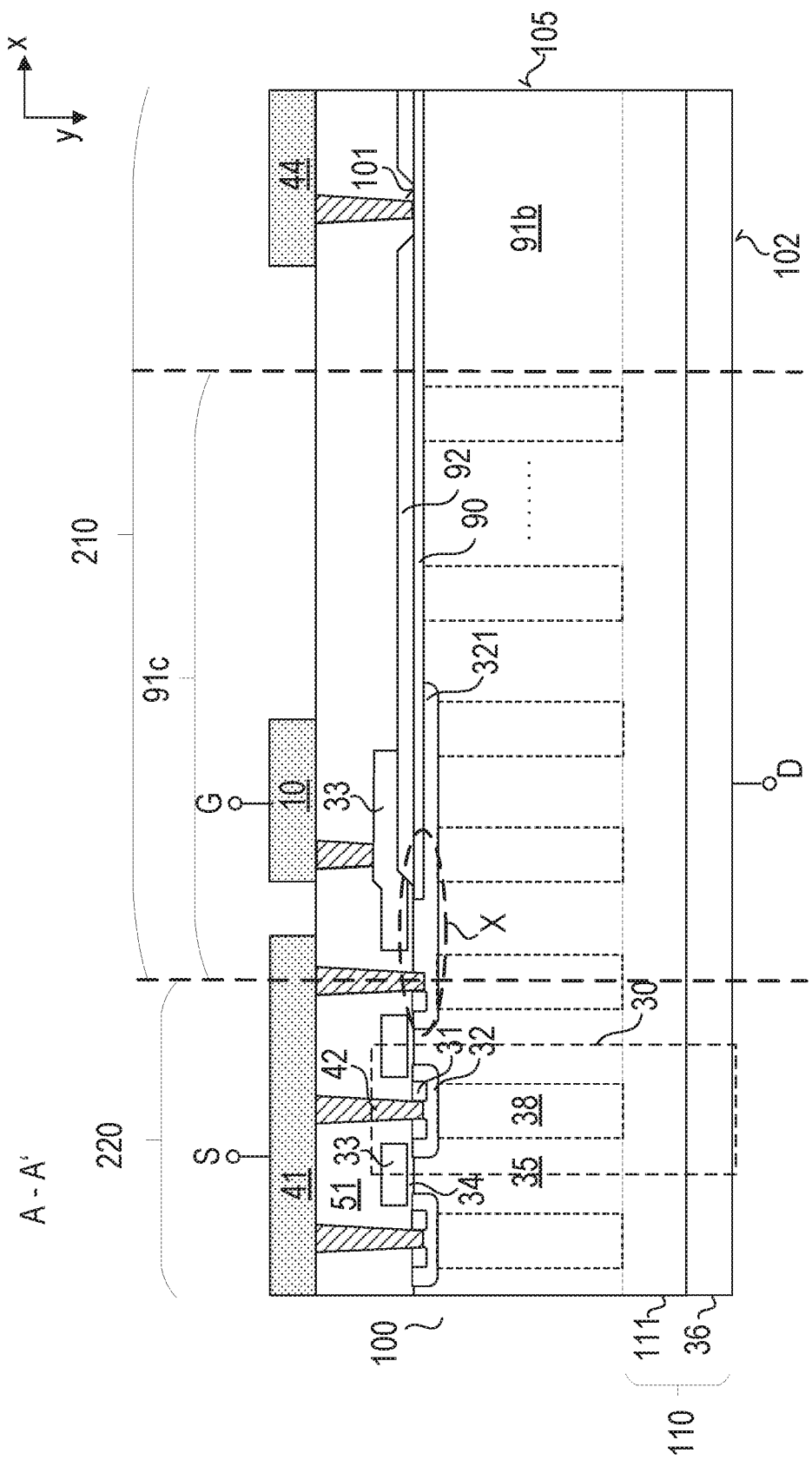
FIG. 1 schematically illustrates a cross sectional view of a semiconductor body.

Referring to FIG. 1, a cross-sectional view of a semiconductor device comprising a semiconductor body 100 is schematically illustrated. The semiconductor body 100 may include a conventional semiconductor material such as, for example, silicon (Si), silicon carbide (SiC), gallium nitride (GaN), gallium arsenide (GaAs), or the like. A transistor device is formed in the semiconductor body 100, the transistor device being arranged in an active region 220 of the semiconductor body 100. In FIG. 1, only a small section of the transistor device is shown. In its active region 220, the semiconductor body 100 includes at least one working transistor cell 30 with a gate electrode 33 that is dielectrically insulated from a body region 32 by a gate dielectric 34. The body region 32 is a doped semiconductor region in the active region 220 of the semiconductor body 100. In the example illustrated in FIG. 1, the body region 32 extends from a first surface 101 into the semiconductor body 100, and the gate electrode 33 is arranged above the first surface 101 of the semiconductor body 100.

The transistor device illustrated in FIG. 1 further includes a drift region 35 formed in the semiconductor body 100. The drift region 35 adjoins the body region 32 of the at least one transistor cell 30 and forms a pn-junction with the body region 32. The drift region 35 is arranged between the body region 32 of the at least one transistor cell 30 and a semiconductor layer 110. The semiconductor layer 110 is arranged between a second surface 102 of the semiconductor body 100 and the drift region 35. The second surface 102 is arranged opposite to the first surface 101 in a vertical direction y of the semiconductor body 100.

The semiconductor layer 110 comprises a common drain region 36 of the same doping type as the drift region 35 and adjoining the second surface 102. The common drain region 36 is shared by the at least one transistor cell 30. A vertical field-stop-region 111 of the same doping type as the drift region 35 and the drain region 36, but less highly doped than the drain region 36, may be arranged between the drift region 35 and the drain region 36. That is, the semiconductor layer 110 may be formed by the drain region 36 and the adjoining vertical field-stop-region 111, as is illustrated in FIG. 1. The vertical field-stop-region 111 may be formed by a single layer or by a plurality of separate sub-layers, e.g., at least two sub-layers. Sub-layers that are arranged closer to the drift region 35 may be less highly doped than sub-layers that are arranged further away from the drift region 35. For example, a doping concentration of a sub-layer that is arranged adjacent to the drift region 35 may be selected from a range of between 1E15 and 5E16 $cm^{-3}$ or lower. A doping concentration of a sub-layer that is arranged adjacent to the drain region 36 may be higher than a doping concentration of a sub-layer that is arranged horizontally above. The doping concentration of the sub-layer that is arranged adjacent to the drain region 36, however, may be lower than a doping concentration of the drain region 36. Generally speaking, a doping concentration of the different sub-layers may increase from the drift region 35 towards the drain region 36. The semiconductor layer 110 comprising a vertical field-stop-region 111 and a drain region 36, however, is only an example. According to another example (not illustrated), the semiconductor layer 110 is formed only by the drain region 36, that is, the drain region 36 may directly adjoin the drift region 35 and at least one compensation region 38, which will be described in further detail below.

Still referring to FIG. 1, the transistor device includes at least one compensation region 38 of a doping type complementary to the doping type of the drift region 35. According to one example, the transistor device includes a plurality of transistor cells 30 and each transistor cell 30 includes a compensation region 38 adjoining the body region 32 of the respective transistor cell 30. In a vertical direction y of the semiconductor body 100, which is a direction perpendicular to the first surface 101 and to the second surface 102, the at least one compensation region 38 in the active region 220 extends from the body region 32 into the semiconductor body 100 towards the semiconductor layer 110.

Still referring to FIG. 1, the transistor device further includes a source electrode 41. The source electrode 41 is electrically connected to the source region 31 and the body region 32 of the at least one transistor cell 30 by means of contact plugs 42. The contact plugs 42 may comprise at least one of tungsten, aluminum, copper, and a Ti/TiN barrier liner, for example. This source electrode 41 forms a source node S or is electrically connected to a source node S of the transistor device. The transistor device further includes a drain node D electrically connected to the drain region 36. A drain electrode electrically connected to the drain region 36 may form the drain node D. Such a drain electrode may comprise a first metallization layer adjacent and electrically connected to the drain region 36. However, such drain electrode is not explicitly illustrated in FIG. 1.

The transistor device can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one compensation region 38 is a p-type region. In a p-type transistor device, the source region 31 is a p-type region, the body region 32 is an n-type region, the drift region 35 is a p-type region, and the at least one compensation region 38 is an n-type region. The transistor device can be implemented as a MOSFET, for example. In a MOSFET, the drain region 36 has the same doping type as the drift region 35, as has been described above. For example, a doping concentration of the drain region 36 is selected from a range of between 1E18 and 1E19 $cm^{-3}$, 1E18 and 1E20 $cm^{-3}$, or 1E18 and 1E21 $cm^{-3}$, doping concentrations of the drift region 35 and the compensation region 38 are selected from a range of between 1E15 and 5E17 $cm^3$, and a doping concentration of the body region 32 is selected from between 5E16 $cm^{-3}$ and 5E17 $cm^{-3}$. The transistor cells 30 illustrated in the Figures are planar transistor cells. Implementing the transistor cells 30 as planar transistor cells, however, is only one example. According to another example, the transistor cells 30 are implemented as trench transistor cells. That is, the at least one gate electrode 33 is arranged in a trench that extends from the first surface 101 into the semiconductor body 100.

In the transistor device explained above, a plurality of transistor cells 30 is connected in parallel. That is, the source regions 31 of these transistor cells 30 are connected to the source node S, the common drain region 36 is connected to the drain node D, and the at least one gate electrode 33 is connected to a gate node G.

The source electrode 41 in the example of FIG. 1 is not a continuous layer completely covering the semiconductor body 100. Referring to FIG. 1, a gate runner 10, and a field plate electrode 44 may be arranged adjacent to the source electrode 41 in a horizontal direction x of the semiconductor body 100. The gate runner 10 may be a circumferential, electrically conducting layer that is configured to electrically couple the gate electrodes 33 to a gate pad (not specifically illustrated). The source electrode 41 and the field plate electrode 44 are not directly connected to each other but are spaced apart with a gap formed between the source electrode 41 and the field plate electrode 44. For example, the gate runner 10 may be arranged in the gap between the source electrode 41 and the field plate electrode 44. The source electrode 41 and the field plate electrode 44 are electrically connected to each other via a base region 321 and a junction termination region 90 formed in the semiconductor body 100.

The base region 321 may be a depletable semiconductor region, i.e. a semiconductor region which is already substantially depleted when in an off-state a reverse voltage is applied between the drain node D and the source node S, reversely biasing the pn-junctions formed between adjoining drift regions 35 and compensation regions 38 which is lower than a rated breakdown voltage of the semiconductor device. Due to using a depletable base region 321, or at least a partly depletable base region 321, a major part of the edge region 210 differs from the source potential at higher reverse voltage. Thus, a reduction of the breakdown voltage may be avoided. "At least partly depletable" in this context refers to a base region 321 that is largely depletable. However, some sections of the base region 321 may not be depletable. For example, a section X of the base region 321 which directly adjoins a contact plug that electrically couples the base region 321 to the source electrode 41 may not be depletable. This is, because this contact region in some applications should not be pinched off. Therefore, the section X forming the transition between the base region 321 and the contact plug may be more highly doped than other sections of the base region 321 that are arranged further away from the contact plug. For example, a doping concentration of the base region 321 may decrease in the horizontal direction x from the contact plug towards a horizontal edge (outer edge) 105 of the semiconductor body 100.

The base region 321 may be of the same doping type as the body regions 32. The doping concentration of the base region 321 is typically chosen such that the base region 321 is substantially depleted only above high enough reverse voltages of e.g. at least about a fifth or half of a rated breakdown voltage which is applied between the source node S and the drain node D. As has been described above, this may not be applicable for the section X of the base region 321 which may be more highly doped and, therefore, may not be depletable at all. The junction termination region 90 may also be a depletable region. The junction termination region 90 may be of the opposite doping type than the body regions 32 and the base region 321 and may form a pn-junction with the base region 321. The base region 321 may extend from the first surface 101 into the semiconductor body 100 and may have a larger width in the horizontal direction x as compared to the body regions 32. The junction termination region 90 may also extend from the first surface 101 into the semiconductor body 100, a first section of the junction termination region 90 being arranged between the first surface 101 and the base region 321. A vertically integrated dopant concentration of the junction termination region 90 may match or may be lower than a vertically integrated dopant concentration of the base region 321. The junction termination region 90 may stabilize the edge region 210 against surface charges on the first surface 101.

The source electrode 41 is electrically connected to the base region 321 by means of a contact plug, and the field plate electrode 44 is electrically connected to the junction termination region 90 by means of a contact plug. The contact plugs, similar to the contact plugs 42 connecting the source electrode 41 and the body regions 32, may comprise at least one of tungsten, aluminum, polysilicon, copper, and a Ti/TiN barrier liner, for example.

According to other examples, the field plate electrode 44 may be replaced by one or more floating field plate electrodes (not illustrated). Such floating field plate electrodes may be formed from polycrystalline semiconductor material, for example, and may not be electrically connected to any of the other elements of the semiconductor device.

The contact plugs 42 that are arranged below the source electrode 41 and, optionally, below the gate runner 10, and the field plate electrode 44 extend from the source and body regions 31, 32, from the gate electrode 33, or from the junction termination region 90 through an insulation layer 51 that is formed on the top surface 101 of the semiconductor body 100 to the source electrode 41, the gate runner 10, or the field plate electrode 44 to electrically couple the source and body regions 31, 32 to the source electrode 41, the gate electrodes 33 to the gate runner 10, and the junction termination region 90 to the field plate electrode 44, respectively. In FIG. 1, the insulation layer 51 is illustrated as a single continuous layer which extends from the first surface 101 of the semiconductor body 100 to the source electrode 41, the gate runner 10, and the field plate electrode 44. This, however, is only an example. Often, a gate oxide layer with a thickness of, e.g., 5 nm to 200 nm or 40 nm to 120 nm, is arranged on the first surface 101 of the semiconductor body 100. The insulation layer 51 may comprise this gate oxide layer and an additional layer which is formed on top of this gate oxide layer. This additional layer may comprise an undoped TEOS (tetraethyl orthosilicate) which may have a thickness of about 50 nm to 500 nm, and a doped BPSG (borophosphosilicate glass) having a thickness of about 200 nm to 2 μm or 1100 nm to 1300 nm, for example. The insulation layer 51, therefore, may comprise several sub-layers. A field oxide layer 92 that is arranged between the first surface 101 and the insulation layer 51 in an edge region 210 is schematically illustrated in FIG. 1. Floating field plate electrodes may be arranged within the insulation layer 51 and may be completely surrounded by the material of the insulation layer 51, for example.

Figure 2:
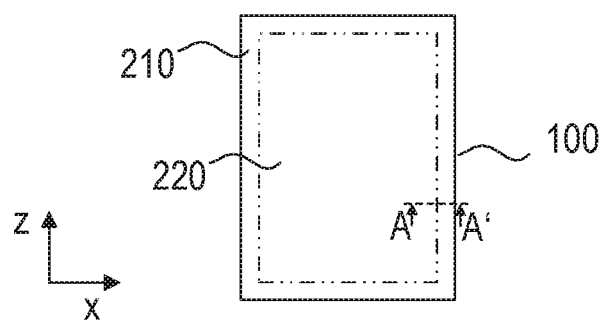
FIG. 2 schematically illustrates a top view of a semiconductor body.

A semiconductor body 100 usually comprises not only an active region 220, but also an inactive region, also referred to as passive region or edge (termination) region 210. The semiconductor arrangement, that is, the plurality of transistor cells 30, may be implemented within the active region 220 of the semiconductor body 100. An edge region 210, e.g., may be a region adjacent to the horizontal edges (outer edges) 105 of the semiconductor body 100. The outer edges 105 extend in the vertical direction y between the first surface 101 and the second surface 102 and are essentially perpendicular to the first surface 101 and the second surface 102. A semiconductor body 100 having a rectangular or square cross section, for example, generally comprises four outer edges 105. According to one example, the active region 220 is horizontally surrounded by the edge region 210, as is schematically illustrated in FIG. 2, which shows a top view of a semiconductor body 100 comprising an active region 220 and an edge region 210. The edge region 210 generally does not comprise any working transistor cells 30. In particular, an edge region 210 may be a region that does not include all active components that are necessary to form a functioning (working) transistor cell 30. Active components are, e.g., gate oxide, source regions 31, body regions 32, gate electrodes 33, or drain regions 36, For example, the edge region 210 may be a region within the semiconductor body 100 which does not comprise any source regions 31.

The source electrode 41 may be arranged on the active region 220 of the semiconductor body 100. A field plate electrode, such as the field plate electrode 44, for example, may be arranged on the edge region 210 of the semiconductor body 100. Optional floating field plate electrodes may also be arranged on the edge region 210. Generally speaking, conductive field plates 44 may be used on the edge region 210 of the semiconductor body 100 in order to spread the electric field more uniformly in the edge region 210. Such field plates 44 may be electrically connected to the underlying pillars formed by the drift regions 35 and the compensation regions 38, such that they can assume the potential of the corresponding pillars. As has been described above, it is, however, also possible to use floating field plates that are not electrically connected to the underlying pillars or to any other elements of the semiconductor device. As is illustrated in FIG. 1, the termination field plate electrode 44 may be arranged adjacent to an outer edge 105 of the edge region 210. The termination field plate electrode 44 may be electrically connected to the junction termination region 90. Such field plates are generally known and will, therefore, not be described in further detail herein.

The edge region 210 may comprise a horizontal field-stop-region 91b of the same doping type as the drift region 35. The horizontal field-stop-region 91b terminates the drift region 35 horizontally towards the outer edge 105. That is, the horizontal field-stop-region 91b extends horizontally from the outer edge 105 into the semiconductor body 100. According to one example, the horizontal field-stop-region 91b may not comprise any compensation regions 38. As is exemplarily illustrated in FIG. 1, the horizontal field-stop-region 91b may be arranged adjacent to a first section 91c of the edge region 210, the first section 91c comprising one or more compensation regions 38. Within the first section 91c, a doping concentration of the drift region 35 may decrease in the first horizontal direction x from the active region 220 towards the horizontal field-stop-region 91b. As has been described above, doping concentrations of the drift region 35 (in the active region 220) may be selected from a range of between 1E15 and 5E17 $cm^{-3}$. In the first section 91c, this doping concentration may decrease towards the horizontal field-stop-region 91b such that a doping concentration of the drift region 35 close to the horizontal field-stop-region 91b may be, e.g., between 20% and up to 90% of the doping concentration of the drift region 35 in the active region 220. The same applies for the compensation regions 38. Within the first section 91c, a compensation region 38 that is arranged closer to the active region 220 may have a doping concentration (e.g., between 1E15 and 5E17 $cm^{-3}$) that is higher than a doping concentration (e.g., between 20% and up to 90% of the doping concentration of the compensation region 38 in the active region 220) of a compensation region 38 that is arranged closer to the horizontal field-stop-region 91b. A doping concentration of the horizontal field-stop-region 91b may be selected from a range of between 1E15 and 1E17 $cm^{-3}$, for example.

According to another example (see, e.g., FIGS. 6, 7 and 8), a substantially intrinsic region 91a may be arranged locally between the horizontal field-stop-region 91b and the active region 220. The substantially intrinsic region 91a does not comprise any compensation regions 38. The substantially intrinsic region 91a may have a doping concentration (e.g., between 1E13 and 5E14 $cm^{-3}$) that is lower than a doping concentration of the drift region 35 in the active region 220 and in the first section 91c. "Locally" in this context refers to an intrinsic region 91a that does not extend all the way from the horizontal field-stop-region 91b to the active region 220. That is, the intrinsic region 91a may not be arranged directly adjacent to the active region 220. The first section 91c of the edge region 210 may be arranged between the active region 220 and the intrinsic region 91a.

The manufacturing of the semiconductor device, that is, e.g., when forming the individual transistor cells 30, is usually performed on wafer-level. That is, a plurality of semiconductor bodies 100 is included in a semiconductor wafer. After forming the semiconductor devices in the individual semiconductor bodies 100, the semiconductor bodies 100 are separated. For example, the individual semiconductor bodies 100 may be separated using mechanical sawing processes or the like. Such processes may result in damages of the semiconductor bodies 100. For example, so-called chip-cracks, may occur during or after a separation (e.g., sawing) process. It is possible, for example, that (micro) cracks or ruptures develop which extend from the outer edges 105 of the semiconductor body 100 into the semiconductor body 100. It is also possible that whole pieces of semiconductor material chip off the semiconductor body 100 during or after the separation process. It is also possible that cracks or chips occur during subsequent handling of the individual semiconductor bodies 100. Cracks may initially occur in the semiconductor layer 110 and, depending on thermomechanical cycling during operation of the semiconductor device the cracks may further penetrate through the whole depth of the semiconductor body 100. Such chips and cracks may adversely affect the operation of the semiconductor device, and may even lead to the failure of the device.

In order to be able to detect chips or cracks, a semiconductor device according to one example comprises a sensor device 80. A semiconductor device comprising a sensor device 80 is exemplarily illustrated in FIG. 3A. As will be described with respect to FIGS. 6, 7, 8 and 11 below, the sensor device 80 comprises a first sensor region 83. The first sensor region 83 may be of the same doping type as the horizontal edge-termination-region 230, and may be integrated in the edge region 210. In particular, the sensor device 80 may be integrated in the horizontal edge-termination-region 230. The first sensor region 83 may be a monocrystalline semiconductor region, for example. The first sensor region 83 is electrically coupled to a first contact pad 81 and to a second contact pad 82. In the example illustrated in FIG. 3A, the first contact pad 81 is arranged on the second surface 102 of the semiconductor body 100 and the second contact pad 82 is arranged on the first surface 101 of the semiconductor body 100. Arranging the contact pads 81, 82 on different sides of the semiconductor body 100, however, is only an example. It is also possible to arrange both contact pads 81, 82 on the first surface 101, or on the second surface 102 (not specifically illustrated).

The first sensor region 83 extends between the first contact pad 81 and the second contact pad 82. In other words, the first sensor region 83 is coupled to the first contact pad 81 with its first end, and to the second contact pad 82 with its second end. The first sensor region 83 is an elongated semiconductor region extending in the edge region 210 and surrounding the active region 220, in order to be able to detect chips and cracks around the circumference of the semiconductor body 100, the first sensor region 83 may extend at least partly around the active region 220. In the example illustrated in FIG. 3A, the first sensor region 83 extends around the active region 220 once. It is, however, also possible that the first sensor region 83 does not fully surround the active region 220. In the example illustrated in FIG. 3A, the first contact pad 81 and the second contact pad 82 are arranged on different sides of the semiconductor body 100. Further, the first contact pad 81 in the example of FIG. 3A is arranged directly below the second contact pad 82 in the vertical direction y.

Figure 3A:
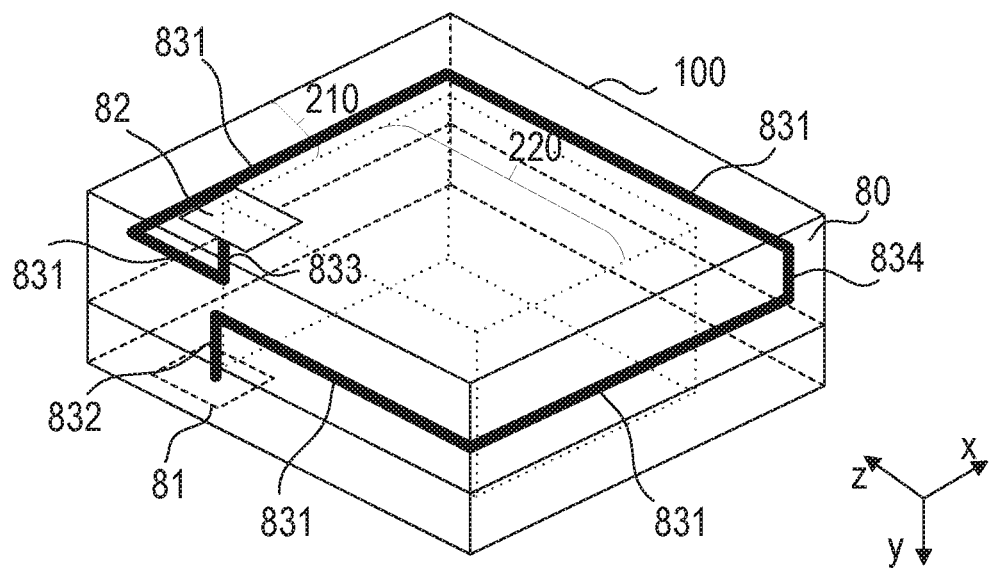
FIGS. 3A and 3B schematically illustrate angled views of semiconductor bodies including a sensor device.
Figure 3B:
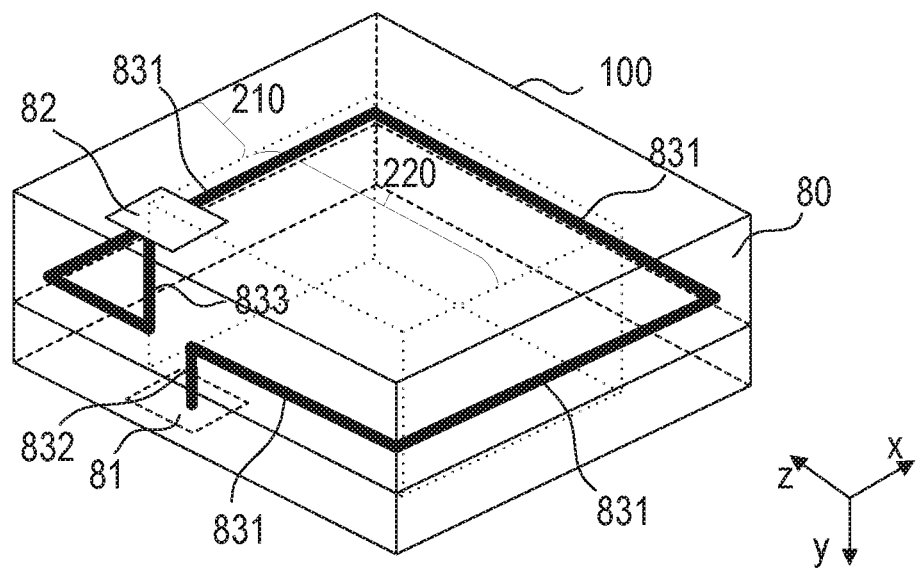

As is illustrated in FIG. 3A, the first sensor region 83 comprises horizontal sections 831. The horizontal sections 831 extend around the active region 220. The first sensor region 83 further comprises a first vertical section 832, extending between a horizontal section 831 and the first contact pad 81, and a second vertical section 833, extending between another one of the horizontal sections 831 and the second contact pad 82. If the contact pads 81, 82 are arranged directly above each other as illustrated in FIG. 3A, the first sensor region 83 may further comprise at least one additional vertical section 834, extending between two horizontal sections 831, as is schematically illustrated in FIG. 3A. If the first sensor region 83 does not comprise an additional vertical section 834, it is generally necessary to arrange the contact pads at least slightly offset, as is schematically illustrated in FIG. 3B. Therefore, according to one example, the first sensor region 83 may surround the active region 220 less than once. However, in order to be able to reliably detect chips and cracks around the entire circumference on all outer edges 105 of the semiconductor body 100, the first sensor region 83 may surround the active region 220, e.g., to at least 80% or at least 90%. Generally, it is also possible that the first sensor region 83 surrounds the active region less than 80%. However, in those regions of the edge region 210 without a first sensor region 83, no chips or cracks may be reliably detected.

At least one of the horizontal sections 831 may extend centrally between the first surface 101 and the second surface 102. That is, a distance between the horizontal section 831 and the first surface 101 may be identical to a distance between the same horizontal section 831 and the second surface 102. This, however, is only an example. It is also possible, that at least some of the horizontal sections 831 are arranged closer to the first surface 101 than to the second surface 102, or vice versa. According to another example, the horizontal sections 831 extend centrally between the first surface 101 and the semiconductor layer 110. For example, the horizontal sections 831 may not be arranged within the drain region 36 or the vertical field-stop-region 111. If a horizontal section 831 is arranged centrally between the first surface 101 and the second surface 102, chips or cracks originating from each of the surfaces 101, 102 may be equally detected. If a horizontal section 831 is arranged closer to one of the surfaces 101, 102, chips or cracks originating from this surface may be more reliably detected than chips or cracks originating from the opposite surface.

Figure 5:
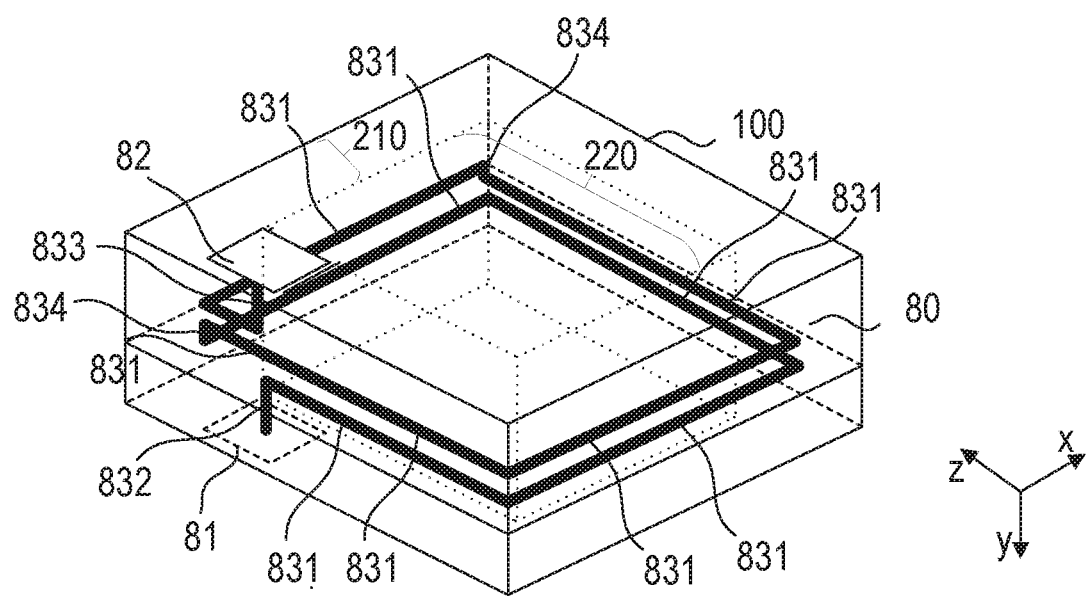
FIG. 5 schematically illustrates an angled view of a semiconductor body including a sensor device according to another example.

According to another example, the first sensor region 83 may also extend around the active region 220 more than once. For example, the first sensor region 83 may extend around the active region 220 at least twice, as is exemplarily illustrated in FIG. 5. However, it is also possible that the first sensor region 83 extends around the active region 220 multiple times. It is also possible that not each of the multiple loops is fully completed. If the first sensor region 83 forms two or more loops around the active region 220, the horizontal sections 831 forming a first loop may be arranged closer to the first surface 101, and horizontal sections 831 forming a second loop may be arranged closer to the second surface 102, for example. In this way, chips or cracks originating from either side of the semiconductor body 100 may be reliably detected.

Figure 4:
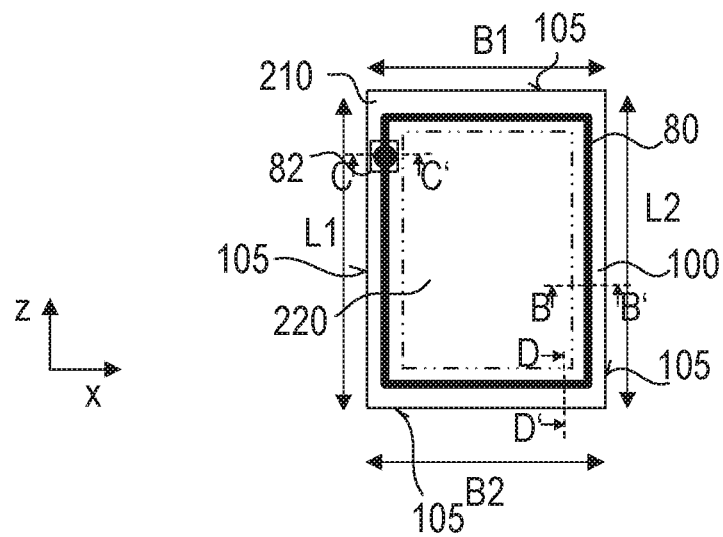
FIG. 4 schematically illustrates a top view of a semiconductor body including a sensor device according to another example.

Now referring to FIG. 4, a top view of a semiconductor device comprising a sensor device 80 is exemplarily illustrated. The semiconductor body 100 may comprise a first longitudinal side L1, a second longitudinal side L2, a first narrow side B1, and a second narrow side B2. The first sensor region 83 may extend along each of the longitudinal sides L1, L2 and along each of the narrow sides B1, B2 at least partially. In FIG. 4, the second contact pad 82 is also schematically illustrated. The first contact pad 81 in this example, similar to the example of FIG. 3A, is arranged vertically below the second contact pad 82 and is, therefore, concealed by the second contact pad 82 in this top view. This, however, is only an example. As has been described above, if one loop of the first sensor region 83 around the active region 220 is not fully completed, the horizontal positions of the first contact pad 81 and the second contact pad 82 may differ from each other.

The first sensor region 83 may be arranged at a first distance $d_1$ from the respective outer edge 105 in a horizontal direction x, z. The horizontal direction x, z is perpendicular to the respective outer edge 105. This is exemplarily illustrated in FIG. 6. The horizontal field-stop-region 91b has a first width $d_{91b}$ in a first horizontal direction x. According to one example, a ratio between the first distance $d_1$ and the first width $d_{91b}$ is between 0.1 and 0.8. For example, the horizontal field-stop-region 91b may have a first width $d_{91b}$ of between 10 µm and 150 µm. The first distance $d_1$ may be between 2 µm and 20 µm, for example. Generally speaking, the first distance $d_1$ may be small enough to be able to detect cracks or chips, and may be great enough not to be influenced by surface charges or residues (e.g., AuSn residues) and not to be unintentionally damaged during separation of the individual semiconductor bodies 100. A certain unevenness (fraying) of the outer edges 105 is common after separation of the semiconductor bodies 100. It is generally unavoidable that the outer edges 105 are damaged (frayed) to a certain degree during separation. Such comparably small damages, however, do not affect the functionality of the semiconductor device. If the first sensor region 83 is arranged too close to the outer edges 105, there is a risk that each individual semiconductor device is detected to be malfunctioning due to the typical fraying, even if no severe chips or cracks have formed in the semiconductor device. On the other hand, if the first sensor region 83 is arranged too far from the outer edge 105, there is a risk that even severe chips or cracks may not be reliably detected.

Figure 6:
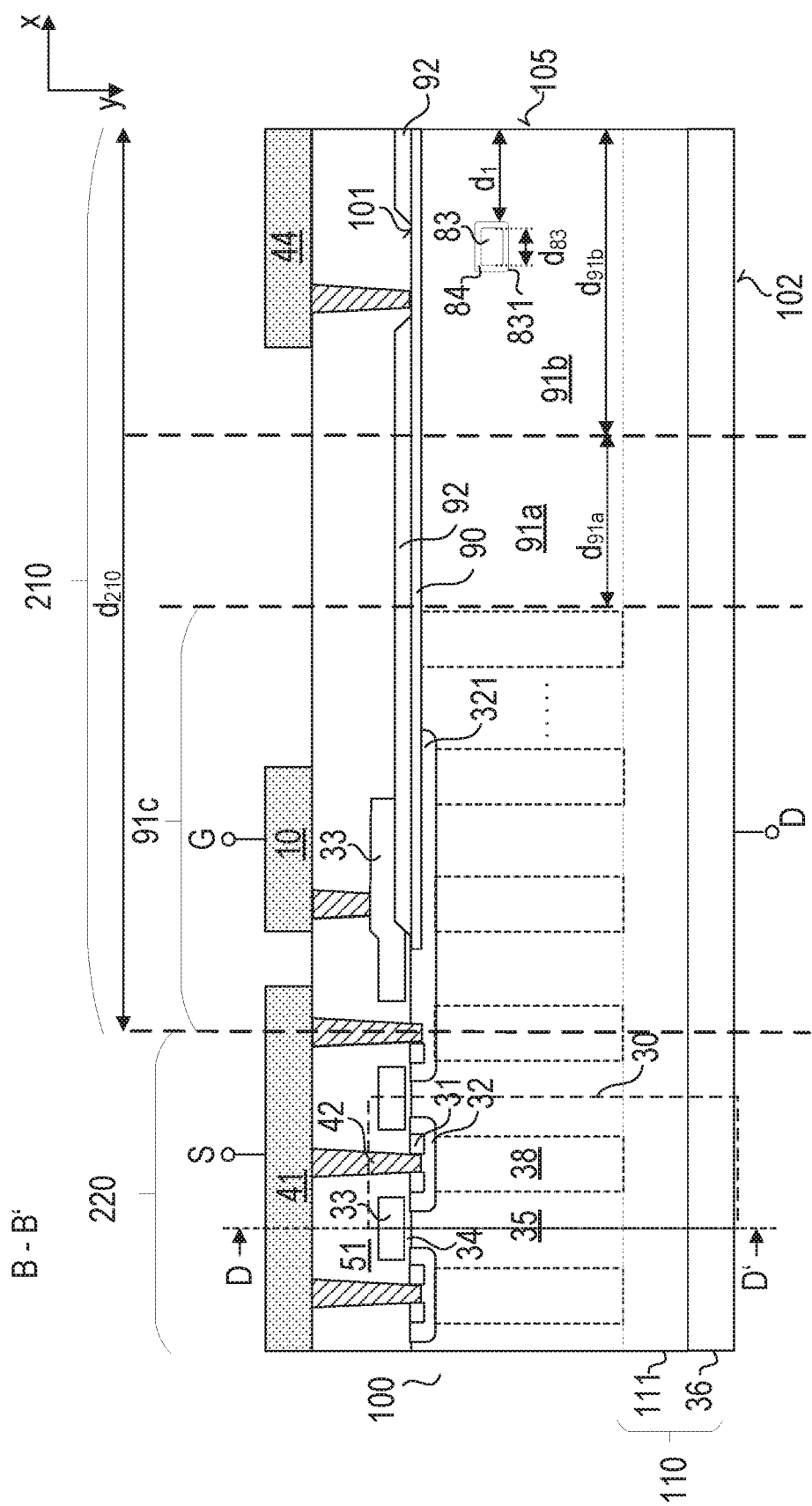
FIG. 6 schematically illustrates a cross sectional view in a section plane B-B' of the semiconductor body of FIG. 4.

Still referring to FIG. 6, the first sensor region 83 may have a second width $d_{83}$ in the horizontal direction x, z. The second width $d_{83}$ may be between 2 µm and 10 µm, for example. However, according to another example, a second width $d_{83}$ of up to several 10 µm is also possible. However, the second width $d_{83}$ is less than the first width $d_{91b}$ of the horizontal field-stop-region 91b such that the first sensor region 83 may be completely enclosed by the horizontal field-stop-region 91b in the horizontal directions x, z.

As is illustrated in FIG. 6, the first sensor region 83 may be separated from the horizontal field-stop-region 91b by means of a second sensor region 84. The second sensor region 84 may surround the first sensor region 83 such that no direct connection is formed between the first sensor region 83 and the horizontal field-stop-region 91b. The second sensor region 84 may be of the second doping type, for example. The second sensor region 84 may be arranged all around the first sensor region 83 except for those surfaces of the first sensor region 83 that are arranged adjacent to the first surface 101 and the semiconductor layer 110, for example. This allows to electrically contact the first sensor region 83.

Figure 7:
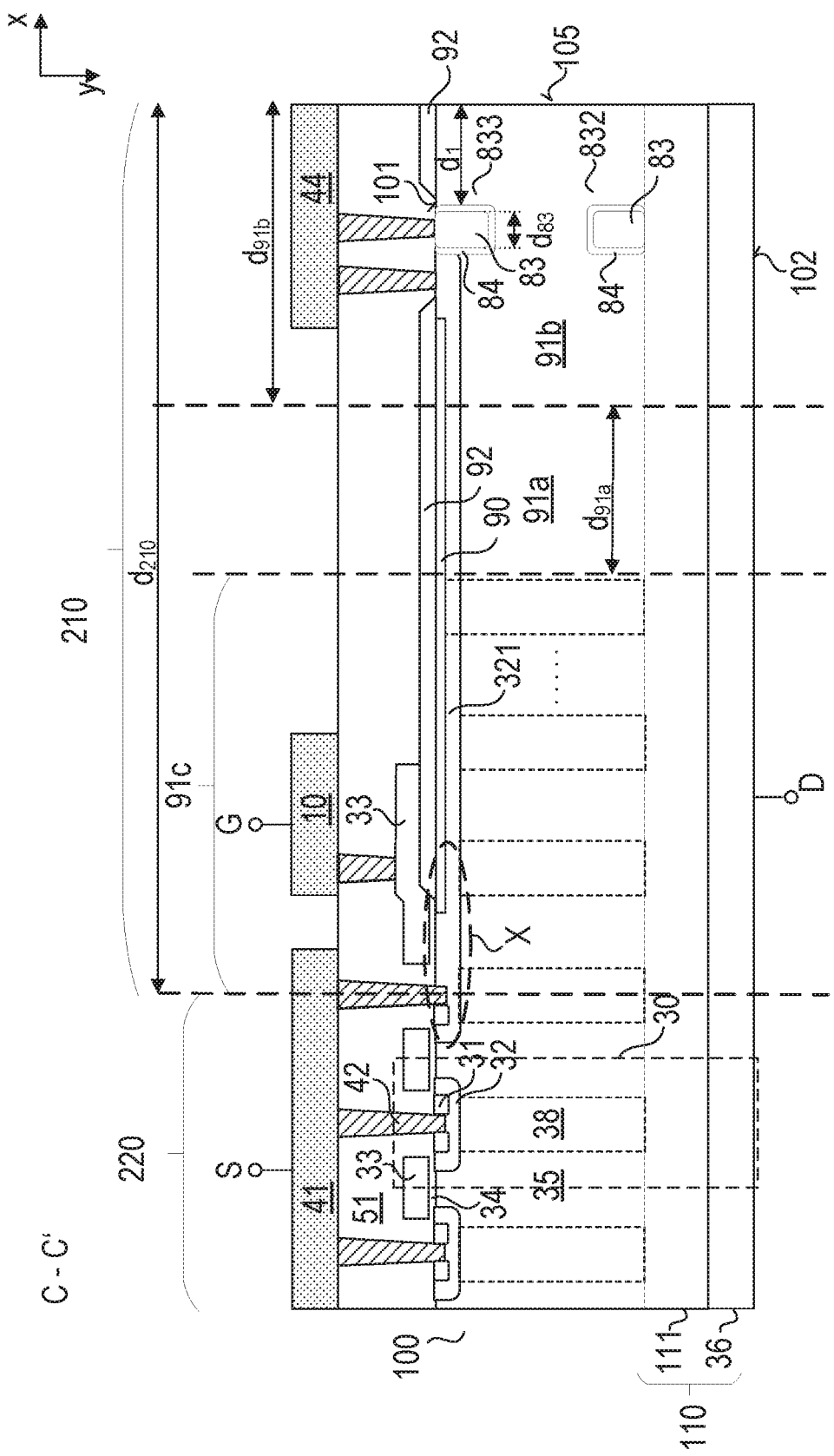
FIG. 7 schematically illustrates a cross sectional view in a section plane C-C' of the semiconductor body of FIG. 4.

FIG. 6 schematically illustrates a cross sectional view of a semiconductor device in a section plane B-B' (see FIG. 4). That is, the cross section of the first sensor region 83 in FIG. 6 is a cross section of one of the horizontal sections 831 extending along the second longitudinal side L2. FIG. 7, on the other hand, schematically illustrates a cross sectional view of a semiconductor device in a section plane C-C' (see FIG. 4). That is, the cross section of the first sensor region 83 illustrated in FIG. 7 is a cross section of the first and second vertical sections 832, 833. The first vertical section 832 illustrated in FIG. 7 extends from the semiconductor layer 110 into the semiconductor body 100 towards the first surface 101, and the second vertical section 833 extends from the first surface 101 into the semiconductor body 100 towards the semiconductor layer 110. The first vertical section 832 may be electrically coupled to a first contact pad on the second surface 102 (first contact pad 81 not specifically illustrated in FIG. 7). However, according to one example, an ohmic contact is formed only between the first sensor region 83 and the first contact pad 81, but not between the second sensor region 84 and the first contact pad.

Figure 8:
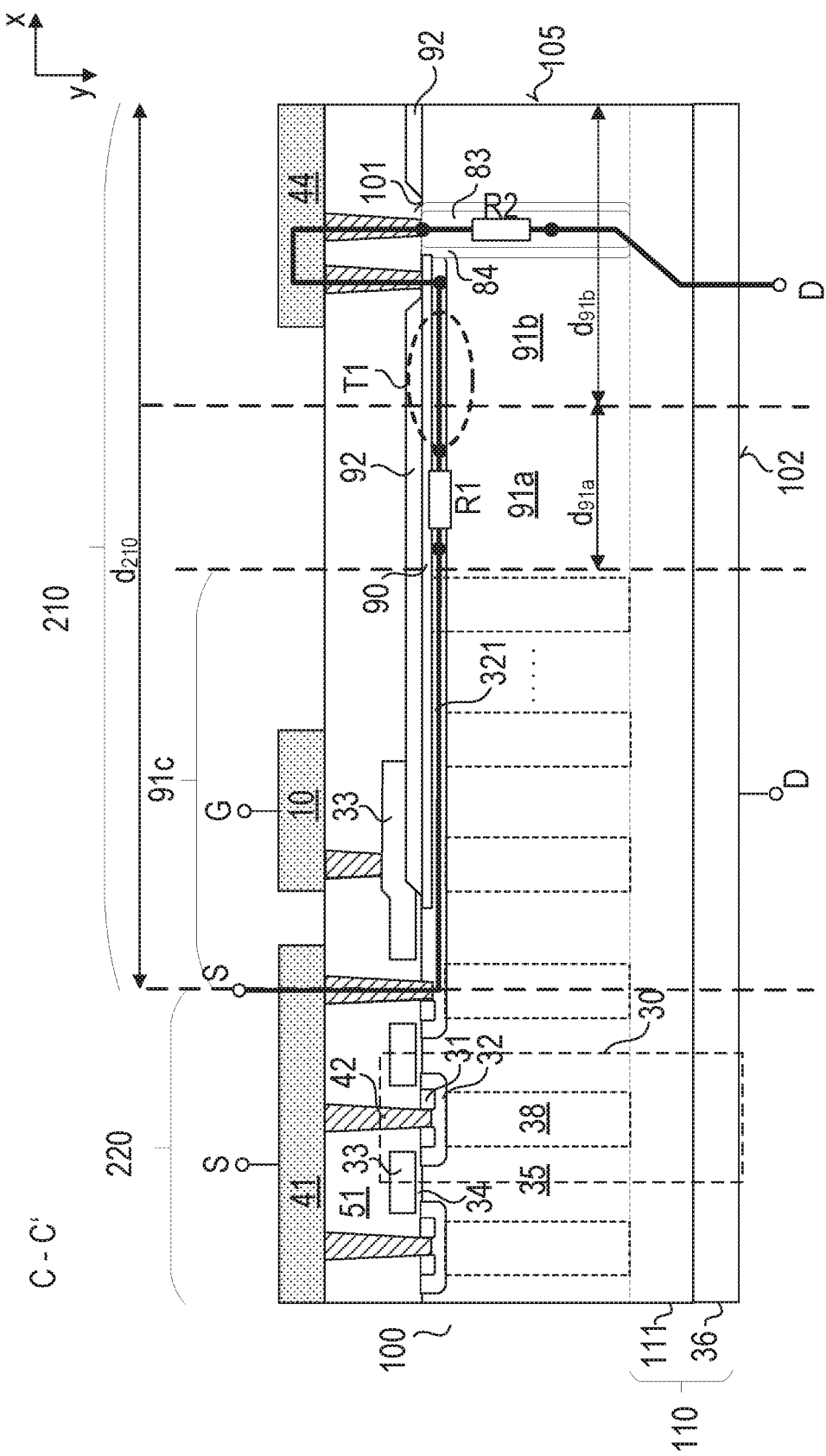
FIG. 8 schematically illustrates a cross sectional view of a semiconductor body including a sensor device.

The second vertical section 833 may be electrically coupled to the field plate electrode 44 by means of a contact plug. As has been described above, the contact plug may comprise at least one of tungsten, aluminum, copper, and a Ti/TiN barrier liner, for example. As has been described above, another contact plug electrically couples the field plate electrode 44 to the junction termination region 90. According to one example, the first contact pad 81 is formed by the drain node D (drain electrode or drain metallization) and the second contact pad 82 is formed by the source node S (source electrode 41). Generally, the drain metallization (not illustrated in the Figures), which is usually a continuous layer (non-structured layer) covering the drain region 36, is not referred to as a "pad". However, as according to some examples the drain metallization may be used as (form) the first contact pad 81, the drain metallization in the following is designated as the "first contact pad" nevertheless. The electrical path between the drain node D and the source node S through the sensor device 80 is schematically illustrated in FIG. 8. For convenience only, the first sensor region 83 and the second sensor region 84 are illustrated as vertical regions extending between the semiconductor layer 110 and the first surface 101. Horizontal sections 831 are not specifically illustrated in FIG. 8. The electrical path extends from the source electrode 41 through a first one of the contact plugs 42 to the base region 321. The base region 321 acts as a first resistance R1. A first JFET T1 may be formed by the base region 321, the junction termination region 90 and the horizontal field-stop-region 91b, wherein the junction termination region 90 and the horizontal field-stop-region 91b may act as a gate of the first JFET T1. The base region 321 may extend from the first contact plug 42 (electrically coupling the source electrode 41 to the base region 321) to the second vertical section 833 and may adjoin the second sensor region 84. The junction termination region 90 may not adjoin the second sensor region 84.

The electrical path further extends through another one of the contact plugs through the field plate electrode 44 and through a third one of the contact plugs 42 to the first sensor region 83. The first sensor region 83 acts as a second resistance R2. The electrical path further extends from the first sensor region 83 through the semiconductor layer 110 to the drain electrode D.

This, however, is only an example. Instead of using the source electrode 41 as the second contact pad 82, it is also possible to provide an additional dedicated sensor pad (not specifically illustrated in FIG. 8) above the first surface 101 or the second surface 102. For example, instead of the field plate electrode 44, a sensor pad may be arranged above the second vertical section 833 of the sensor device 80. That is, the field plate electrode 44 may be omitted in a section above the second vertical section 833, but may be present in those sections along the outer edges 105 that are arranged above the horizontal sections 831 of the sensor device 80. Such a dedicated sensor pad may be electrically coupled to the first sensor region 83 by means of a contact plug 42.

Irrespective of whether the source electrode 41 serves as the second contact pad 82 or whether the semiconductor device comprises a dedicated sensor pad, the first sensor region 83 acts as a resistor R2 between the first contact pad 81 and the second contact pad 82. If a chip or crack occurs, this affects the electrical properties of the first sensor region 83, thereby altering the resistor value of the first sensor region 83. That is, if a change of the resistor value of the first sensor region 83 is detected, this may be seen as an indicator that a chip or crack occurred. Severe chips or cracks may also completely interrupt an electrical connection between the first contact pad 81 and the second contact pad 82.

Figure 9:
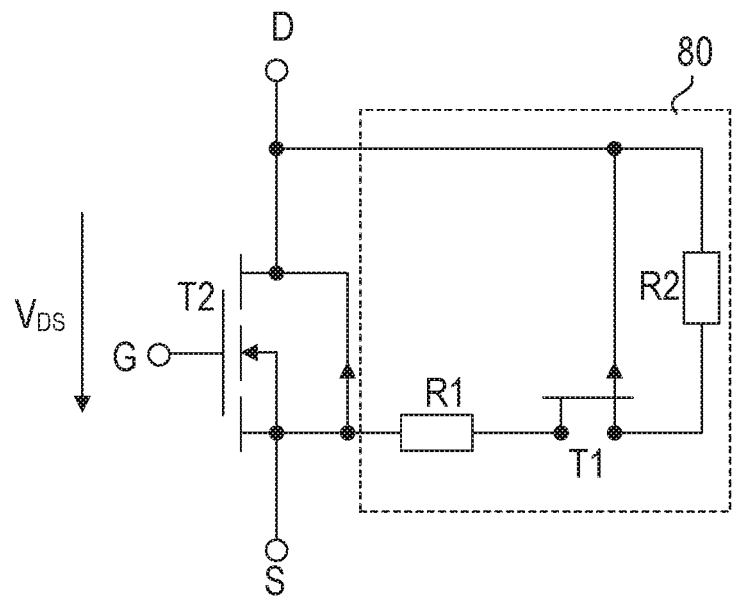
FIG. 9 schematically illustrates an equivalent circuit of the semiconductor device and the sensor device included in a semiconductor body.

Now referring to FIG. 9, an exemplary equivalent circuit of the arrangement of FIG. 8 is illustrated. The second transistor device T2 illustrated in the circuit diagram of FIG. 9 corresponds to the transistor device formed by the plurality of transistor cells 30. The sensor device 80 is electrically coupled in parallel to the second transistor device T2 between the source node S and the drain node D. The first resistor R1, the first transistor device (JFET) T1, and the second resistor R2 are coupled in series between the source node S and the drain node D. A gate node of the first transistor device T1 is coupled to the drain node D. The first transistor device T1 may be a p-channel JFET, as the current carrying path between its source and its drain may be formed by the base region 321, which may be a p-type region. The first transistor device T1 is an n-channel JFET, if the base region 321 is an n-type region.

For low drain-source voltages $1V<V_{DS}<5V$, the second transistor device TT2 may represent a p-type resistor. This results in an applicable drain-source current of the sensor device 80 in the range of several 100 nA up to several 100 µA or even up to several 1 mA. When a chip or crack occurs, the resistance value of the second resistor R2 significantly increases.

Figure 10:
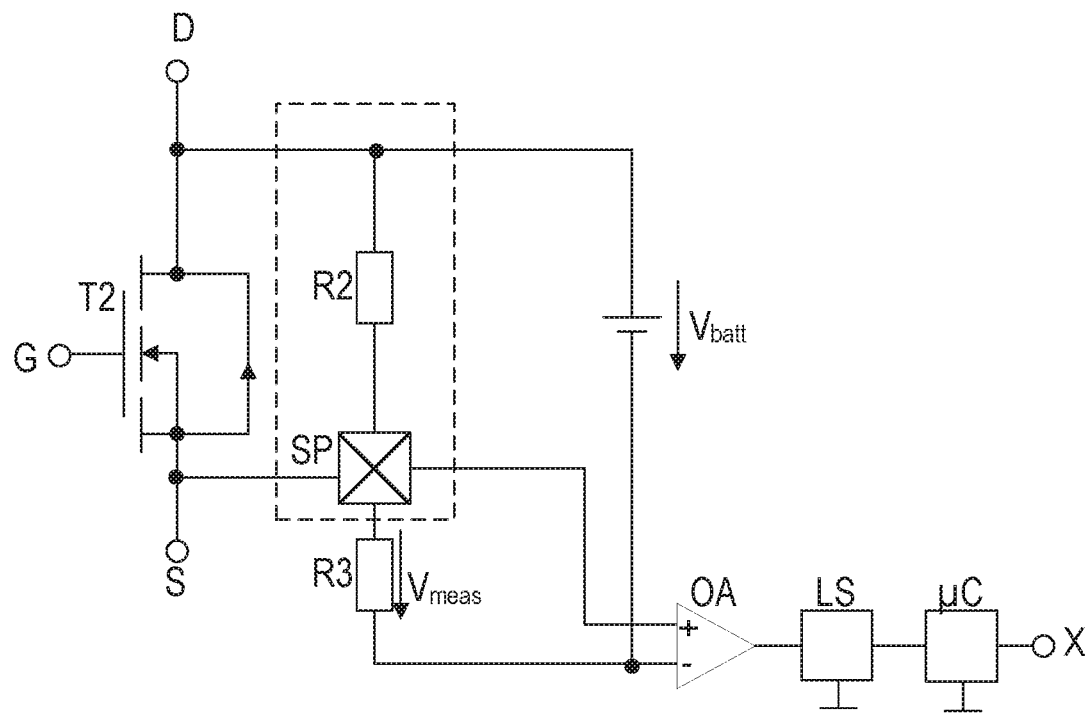
FIG. 10 schematically illustrates a circuit diagram of a circuit for detecting chip cracks.

Now referring to FIG. 10, an exemplary circuit diagram of a circuit for detecting chip cracks is schematically illustrated. In particular, FIG. 10 schematically illustrates external circuitry that may be coupled to the first contact pad 81 and the second contact pad 82. For example, an external sense resistor R3 may be coupled to the second contact pad 82 (sense pad SP). The sense resistor R3 may be a high ohmic shunt resistor, for example. A measuring voltage $V_{batt}$ may be applied via a series connection of the second resistor R2 and the sense resistor R3. If a chip or a crack occurs which extends into the first sensor region 83, the resulting sensing current decreases. As a consequence, the sensing voltage $V_{meas}$ across the sense resistor R3 will significantly decrease. The voltage drop of the sensing voltage $V_{meas}$ may be detected by a detection circuit comprising, e.g., an operational amplifier OA. The amplified voltage may be provided to a level shifter LS which may shift the amplified voltage to a lower electrical potential in order to be able to provide the voltage to a microcontroller µC. The microcontroller µC may be configured to evaluate the detected voltage, detect whether a chip or crack occurred, and to set the semiconductor device to a safe state and to generate a warning, for example, if a chip or crack has been detected. The circuit illustrated in FIG. 10, however, is only an example. Any other suitable circuit may be used to detect a chip or crack which corrupts the first sensor region 83.

Figure 11:
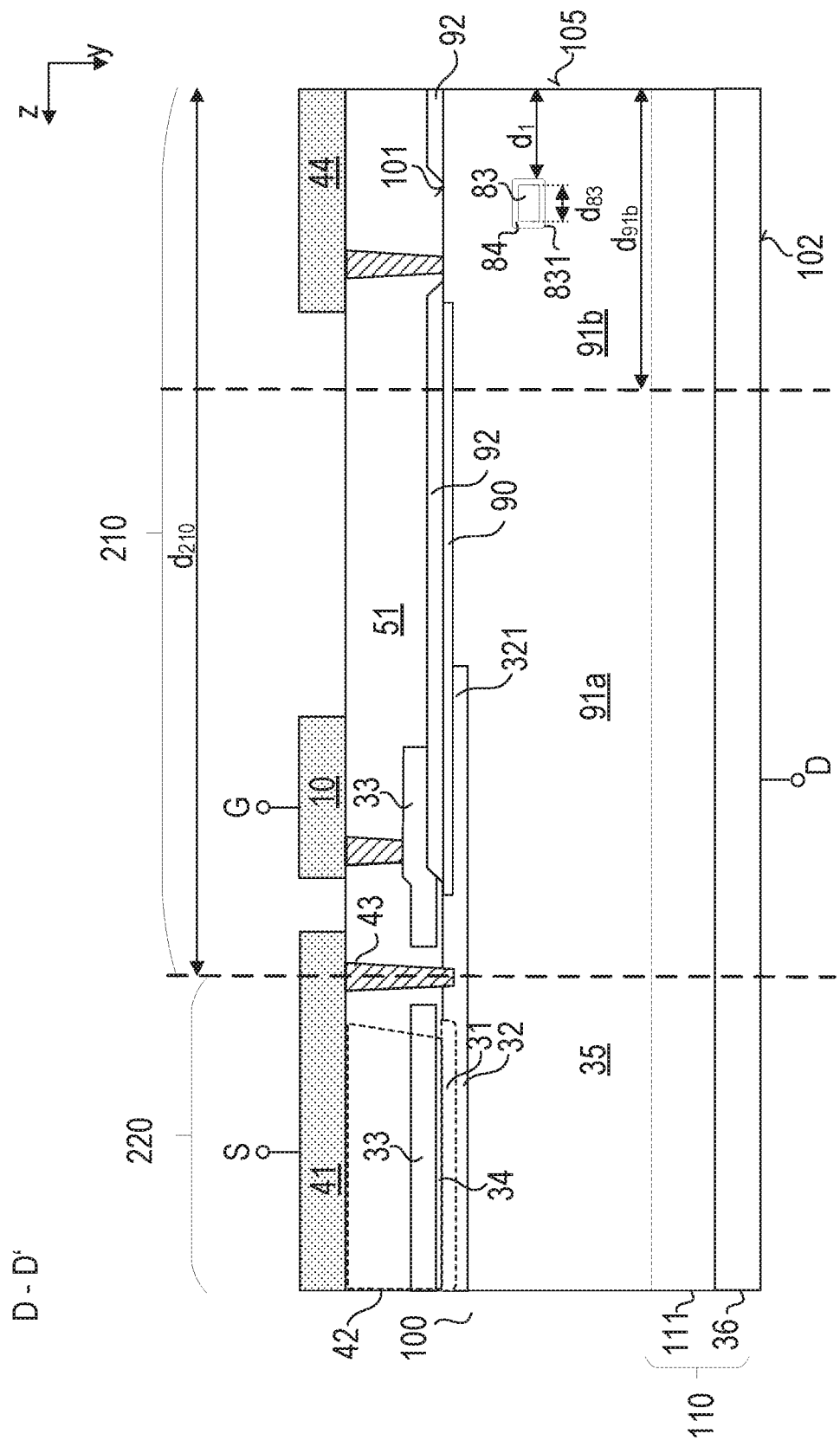
FIG. 11 schematically illustrates a cross sectional view in a section plane D-D' of the semiconductor body of FIG. 4.

Now referring to FIG. 11, a cross-sectional view of the semiconductor device of FIG. 4 in a section plane D-D' is schematically illustrated. The gate electrodes 33 of the transistor cells 30 may be provided as a plurality of longitudinal semiconductor regions. A length of the gate electrodes 33 in the second horizontal direction z may be considerably larger than a respective width in the first horizontal direction x, the horizontal directions x, z being perpendicular to each other. The gate electrodes 33 may have an elongated form that is similar to the form of the compensation regions 38. Each of the gate electrodes 33 may be electrically connected to a gate runner 10, for example. The gate runner 10 may be a circumferential, electrically conducting layer which electrically couples the gate electrodes 33 to the gate pad 43. In the example illustrated in FIG. 11, the gate runner 10 overlaps each of the longitudinal gate electrodes 33, that is, at least one end of each of the gate electrodes 33 is located below the gate runner 10 in the vertical direction y. According to one example, all ends of the gate electrodes 33 that are overlapped by the gate runner 10 are electrically connected to the gate runner 10. However, it is also possible that some ends that are overlapped by the gate runner 10 are not directly connected to the gate runner 10 (not illustrated in the Figures). "Not directly connected" means that there is no contact plug between the longitudinal end of the respective gate electrodes 33 and the gate runner 10. However, such longitudinal ends may still be indirectly connected to the gate runner 10 via another one of the gate electrodes 33.

As has been described with respect to FIGS. 1, 6 and 7 above, an insulation layer 51 is formed on top of the first surface 101 of the semiconductor body 100. As is illustrated in FIG. 11, the gate runner 10 may be formed on this insulation layer 51. A source region 31 is illustrated in dashed lines in FIG. 11, as it is arranged in a plane different from the plane that is illustrated in the Figure and is not immediately visible in the cross-section of FIG. 11. The same applies for the contact plug 42 that is also illustrated in dashed lines. The contact plugs 42 may be provided as a plurality of longitudinal regions. A length of the contact plugs 42 in the second horizontal direction z may be considerably larger than a respective width in the first horizontal direction x. Along the narrow sides B1, B2 of the semiconductor body 100, the boundary between the edge region 210 and the active region 220 is usually defined by the lateral end of the source region 31 or, more specifically, by a contact plug 43 electrically coupling the base region 321 to the source electrode 41. That is, the width $d_{210}$ of the edge region 210 generally corresponds to a distance between the contact plug 43 that electrically couples the base region 321 to the source electrode 41 and the outer edge 105 of the semiconductor body 100. This, however, is only an example.

FIG. 11 schematically illustrates a cross-section through one of the pillars formed by the drift region 35. The doping concentration of the drift region 35 may decrease in the in the intrinsic region 91a from the drift region towards the horizontal field-stop-region 91b in the second horizontal direction z. The same applies for the doping concentration of the compensation regions 38 (not illustrated in FIG. 11) which may decrease towards the horizontal field-stop-region 91b in the second horizontal direction z.

The first semiconductor region 83 may extend in the edge region 210 along the narrow sides B1, B2 in the same way as has been described with respect to the longitudinal sides L1, L2 in FIG. 6 above. In the examples described above, the first contact pad 81 and the second contact pad 82 are arranged adjacent to the first longitudinal side L1 of the semiconductor body 100. This, however, is only an example. It is generally also possible to arrange the first contact pad 81 and the second contact pad 82 adjacent to any one of the first and second longitudinal sides L1, L2 and the first and second narrow sides B1, B2. The first contact pad 81 and the second contact pad 82 do not necessarily need to be arranged adjacent to the same side L1, L2, B1, B2.

The monolithically integrated sensor device 80 that has been described with respect to the Figures above allows to efficiently test semiconductor devices with regard to chips and cracks in a very fast and cost-effective way. The sensor device 80 is not active during normal operation of the transistor device formed by the plurality of transistor cells 30.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body comprising a first surface, a second surface opposite to the first surface, an active region, and an edge region surrounding the active region in a horizontal plane;
a plurality of transistor cells at least partly integrated in the active region, each transistor cell comprising a source region, a body region, a drift region separated from the source region by the body region, and a gate electrode dielectrically insulated from the body region; and
a sensor device comprising a first sensor region of a first doping type integrated in the edge region,
wherein the first sensor region is electrically coupled to a first contact pad and to a second contact pad,
wherein each of the first contact pad and the second contact pad is arranged either on the first surface or on the second surface,
wherein the sensor device at least partially extends around the active region.

2. The semiconductor device of claim 1, wherein the edge region comprises a horizontal field-stop-region of the first doping type surrounding the active region in the horizontal plane.

3. The semiconductor device of claim 2, wherein the semiconductor body comprises an outer edge extending between the first surface and the second surface, and wherein the horizontal field-stop-region is arranged adjacent to the outer edge.

4. The semiconductor device of claim 3, wherein the first sensor region is arranged at a first distance from the outer edge, in a horizontal direction perpendicular to the outer edge, wherein the horizontal field-stop-region has a first width in the horizontal direction, and wherein a ratio between the first distance and the first width is between 0.1 and 0.8.

5. The semiconductor device of claim 4, wherein the first distance is between 2 µm and 20 µm.

6. The semiconductor device of claim 2, wherein the sensor device further comprises a second sensor region of a second doping type complementary to the first doping type, enclosing the first sensor region and thereby separating the first sensor region from the horizontal field-stop-region.

7. The semiconductor device of claim 1, wherein the first sensor region has a second width in a horizontal direction of between 2 µm and 10 µm.

8. The semiconductor device of claim 1, wherein each transistor cell further comprises a drain region arranged between the drift region and the second surface, and wherein the drain region of each transistor cell is formed by a semiconductor region that is common to the plurality of transistor cells.

9. The semiconductor device of claim 8, further comprising:
a first metallization layer adjacent and electrically connected to the drain region; and
a second metallization layer on the first surface and electrically connected to the source regions of the plurality of transistor cells,
wherein the first metallization layer forms the first contact pad.

10. The semiconductor device of claim 9, wherein the second metallization layer forms the second contact pad.

11. The semiconductor device of claim 10, further comprising:
a base region; and
a junction termination region,
wherein the base region acts as a first resistance,
wherein the first sensor region acts as a second resistance,
wherein a transistor device is formed by the base region, the junction termination region and the horizontal field-stop-region, and wherein the first resistance, the transistor device, and the second resistance are electrically coupled in series between the second metallization layer and the first metallization layer.

12. The semiconductor device of claim 9, wherein the second metallization layer and the second contact pad are formed separately and are electrically insulated from each other.

13. The semiconductor device of claim 1, wherein the sensor device further comprises horizontal sections extending around the active region, a first vertical section, and a second vertical section, and wherein each of the first vertical section and the second vertical section extends between a horizontal section and one of the first contact pad and the second contact pad.

14. The semiconductor device of claim 13, wherein the horizontal sections at least partially encircle the active region, thereby at least partially forming a loop, and wherein the horizontal sections that form at least part of the loop are arranged centrally between the first surface and the second surface.

15. The semiconductor device of claim 13, wherein the horizontal sections extend around the active region at least twice, forming at least a first loop and a second loop, wherein the horizontal sections of the first loop are arranged closer to the first surface than to the second surface, wherein the horizontal sections of the second loop are arranged closer to the second surface than to the first surface, and wherein at least one of the first vertical section and the second vertical section is arranged between the first loop and the second loop.

* * * * *